United States Patent
Janssens et al.

(10) Patent No.: US 12,287,586 B2
(45) Date of Patent: *Apr. 29, 2025

(54) STAGE SYSTEM, LITHOGRAPHIC APPARATUS, METHOD FOR POSITIONING AND DEVICE MANUFACTURING METHOD

(71) Applicant: ASML NETHERLANDS B.V., Veldhoven (NL)

(72) Inventors: Stef Marten Johan Janssens, Eindhoven (NL); Bert Dirk Scholten, Best (NL); Sjoerd Nicolaas Lambertus Donders, Vught (NL); Teunis Van Dam, Eindhoven (NL); Peter Mark Overschie, Eindhoven (NL); Theresa Mary Spaan-Burke, Eindhoven (NL); Siegfried Alexander Tromp, Knegsel (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/398,860

(22) Filed: Dec. 28, 2023

(65) Prior Publication Data

US 2024/0168394 A1    May 23, 2024

Related U.S. Application Data

(63) Continuation of application No. 16/309,501, filed as application No. PCT/EP2017/064265 on Jun. 12, 2017, now Pat. No. 11,860,552.

(30) Foreign Application Priority Data

Jul. 1, 2016 (EP) ..................................... 16177447
Mar. 1, 2017 (EP) ..................................... 17158730

(51) Int. Cl.
G03F 7/00      (2006.01)
H01L 21/683    (2006.01)
H01L 21/67     (2006.01)

(52) U.S. Cl.
CPC .......... G03F 7/70725 (2013.01); G03F 7/707 (2013.01); G03F 7/70783 (2013.01);
(Continued)

(58) Field of Classification Search
CPC .. G03F 7/70725; G03F 7/707; G03F 7/70716; G03F 7/70775; G03F 7/70733;
(Continued)

(56) References Cited

U.S. PATENT DOCUMENTS 5,793,474 A    8/1998  Nishi
7,440,081 B2  10/2008  Gui et al.
(Continued)

FOREIGN PATENT DOCUMENTS

JP    06330944    11/1994
JP   2006146195     6/2006
(Continued)

OTHER PUBLICATIONS

International Search Report and Written Opinion issued in corresponding PCT Patent Application No. PCT/EP2017/064265, dated Sep. 20, 2017.

(Continued)

*Primary Examiner* — Christina A Riddle
(74) *Attorney, Agent, or Firm* — Pillsbury Winthrop Shaw Pittman, LLP

(57) ABSTRACT

A system for positioning, a stage system, a lithographic apparatus, a method for positioning and a method for manufacturing a device in which use is made of a stage system that includes a plurality of gas bearing devices. Each gas bearing device includes: a gas bearing body, which has (Continued)

a free surface, a primary channel which extends through the gas bearing body and has an inlet opening in the free surface, a secondary channel system which extends through the gas bearing body and which has a plurality of discharge openings in the free surface. The flow resistance in the secondary channel system is higher than the flow resistance in the primary channel.

20 Claims, 7 Drawing Sheets

(52) U.S. Cl.
CPC ...... *G03F 7/70816* (2013.01); *H01L 21/6838* (2013.01); *H01L 21/67288* (2013.01)

(58) Field of Classification Search
CPC ............ G03F 7/70783; G03F 7/70791; G03F 7/70816; G03F 7/7085; H01L 21/6838; H01L 21/67288; H01L 21/6875; G02F 1/1303
USPC ......... 355/30, 52, 53, 55, 67–77; 250/492.1, 250/492.2; 264/293; 269/20, 21, 24, 37
See application file for complete search history.

(56) References Cited

U.S. PATENT DOCUMENTS

| | | | | |
|---|---|---|---|---|
| 7,635,445 | B2* | 12/2009 | Choi | B82Y 10/00 264/319 |
| 9,696,633 | B2 | 7/2017 | Onvlee et al. | |
| 11,860,552 | B2* | 1/2024 | Janssens | G03F 7/70725 |
| 2003/0002756 | A1 | 1/2003 | Shinohara et al. | |
| 2005/0040338 | A1 | 2/2005 | Weiss et al. | |
| 2006/0054774 | A1 | 3/2006 | Yassour et al. | |
| 2006/0098176 | A1 | 5/2006 | Gui et al. | |
| 2007/0017442 | A1 | 1/2007 | Yamasaki et al. | |
| 2007/0063453 | A1 | 3/2007 | Ishikawa et al. | |
| 2007/0152690 | A1* | 7/2007 | Sung | G03F 7/707 324/750.16 |
| 2007/0195653 | A1* | 8/2007 | Yassour | B24B 37/30 369/13.24 |
| 2008/0229811 | A1 | 9/2008 | Zhao et al. | |
| 2008/0316461 | A1* | 12/2008 | Compen | H01L 21/6875 355/73 |
| 2009/0255447 | A1 | 10/2009 | Schubert et al. | |
| 2010/0300294 | A1 | 12/2010 | Clinton et al. | |
| 2011/0042874 | A1 | 2/2011 | Aoki et al. | |
| 2011/0043784 | A1 | 2/2011 | Aoki et al. | |
| 2011/0280703 | A1 | 11/2011 | Cadee et al. | |
| 2012/0139192 | A1* | 6/2012 | Ooi | B25B 11/005 29/559 |
| 2013/0021593 | A1 | 1/2013 | Onvlee et al. | |
| 2013/0063709 | A1 | 3/2013 | Chen | |

FOREIGN PATENT DOCUMENTS

| | | |
|---|---|---|
| JP | 2007533153 | 11/2007 |
| JP | 2009104029 | 5/2009 |
| JP | 2013524289 | 6/2013 |
| JP | 2014022378 | 2/2014 |
| KR | 100527241 | 11/2005 |
| WO | 2008121561 | 10/2008 |
| WO | 2008156366 | 12/2008 |

OTHER PUBLICATIONS

Notification of Reasons for Refusal dated Nov. 19, 2019 issued in corresponding Japanese Patent Application No. 2018-568740.
International Preliminary Report on Patentability and Written Opinion issued in corresponding PCT Patent Application No. PCT/EP2017/064265, dated Jan. 10, 2019.
English translation of JP2009-104029, published May 14, 2009. (Year: 2009).

* cited by examiner

STAGE SYSTEM, LITHOGRAPHIC APPARATUS, METHOD FOR POSITIONING AND DEVICE MANUFACTURING METHOD

This application is a continuation of U.S. patent application Ser. No. 16/309,501 filed on Dec. 13, 2018, which is the U.S. national phase entry of PCT patent application no. PCT/EP2017/064265, which was filed on Jun. 12, 2017, which claims the benefit of priority of European patent application no. 16177447.6, which was filed on Jul. 1, 2016, and of European patent application no. 17158730.6, which was filed on Mar. 1, 2017, each of the foregoing applications is incorporated herein in its entirety by reference.

FIELD

The present description relates to a stage system, a lithographic apparatus, a method for positioning and a method for manufacturing a device in which use is made of a stage system.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

SUMMARY

A lithographic apparatus often comprises a stage system for positioning the substrate and/or the patterning device. The substrate and the patterning device need to be positioned very accurately. The positioning can be adversely affected when the substrate or patterning device is not entirely flat, but for example warped, concave, convex, or having another low order Zernike shape.

PCT Patent Application Publication No. WO2008/156366 proposes to flatten a substantially planar object prior to clamping it on an object table by using jets of pressurised gas. The object table is provided with a recess which is connected to a vacuum source, and with nozzles that are adapted to emit jets of pressurized gas. The balance between the attracting force of the vacuum and the repelling force caused by the jets makes that the object floats at a distance above the object table, and that deviations from the flat shape of the object are corrected to some extent.

The known system is not very stable.

It is desirable to provide a stable system and method which allows accurate positioning of an object relative to a surface.

According to an embodiment of the invention, a stage system is provided for positioning an object, which stage system comprises:
an object table adapted to support the object to be positioned,
which object table is provided with a plurality of air bearing devices,
wherein each air bearing device comprises:
an air bearing body, which has a free surface,
a primary channel which extends through the air bearing body and has an inlet opening in the free surface,
a secondary channel system which extends through the air bearing body and which has a discharge opening in the free surface,
wherein the flow resistance in the secondary channel system is higher than the flow resistance in the primary channel.

In another embodiment of the invention, there is provided a lithographic apparatus arranged to transfer a pattern from a patterning device onto a substrate, wherein the lithographic apparatus comprises a stage system according to the invention.

In another embodiment of the invention, there is provided a lithographic apparatus comprising:
an illumination system configured to condition a radiation beam;
a support constructed to support a patterning device, the patterning device being capable of imparting the radiation beam with a pattern in its cross-section to form a patterned radiation beam;
a substrate table constructed to hold a substrate; and
a projection system configured to project the patterned radiation beam onto a target portion of the substrate,
wherein the substrate table is provided with a plurality of air bearing devices, each air bearing device comprising:
an air bearing body, which has a free surface,
a primary channel which extends through the air bearing body and has an inlet opening in the free surface,
a secondary channel system which extends through the air bearing body and which has a discharge opening in the free surface,
wherein the flow resistance in the secondary channel system is higher than the flow resistance in the primary channel.

In another embodiment of the invention, there is provided a device manufacturing method comprising transferring a pattern from a patterning device onto a substrate, wherein use is made of a stage system according to the invention.

In another embodiment of the invention, there is provided a method for positioning an object, the method comprising:
arranging an object on or above the object table of a stage system according to an embodiment of the invention, and
making pressurized gas flow out of the discharge openings of the secondary channel systems of at least one air bearing device of the stage system according to an embodiment of the invention while simultaneously applying a sub-atmospheric pressure to the inlet of the primary channel of at least one air bearing device of the stage system according to an embodiment of the invention, thereby keeping the object in a position spaced apart from the object table in a direction perpendicular to the object table.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
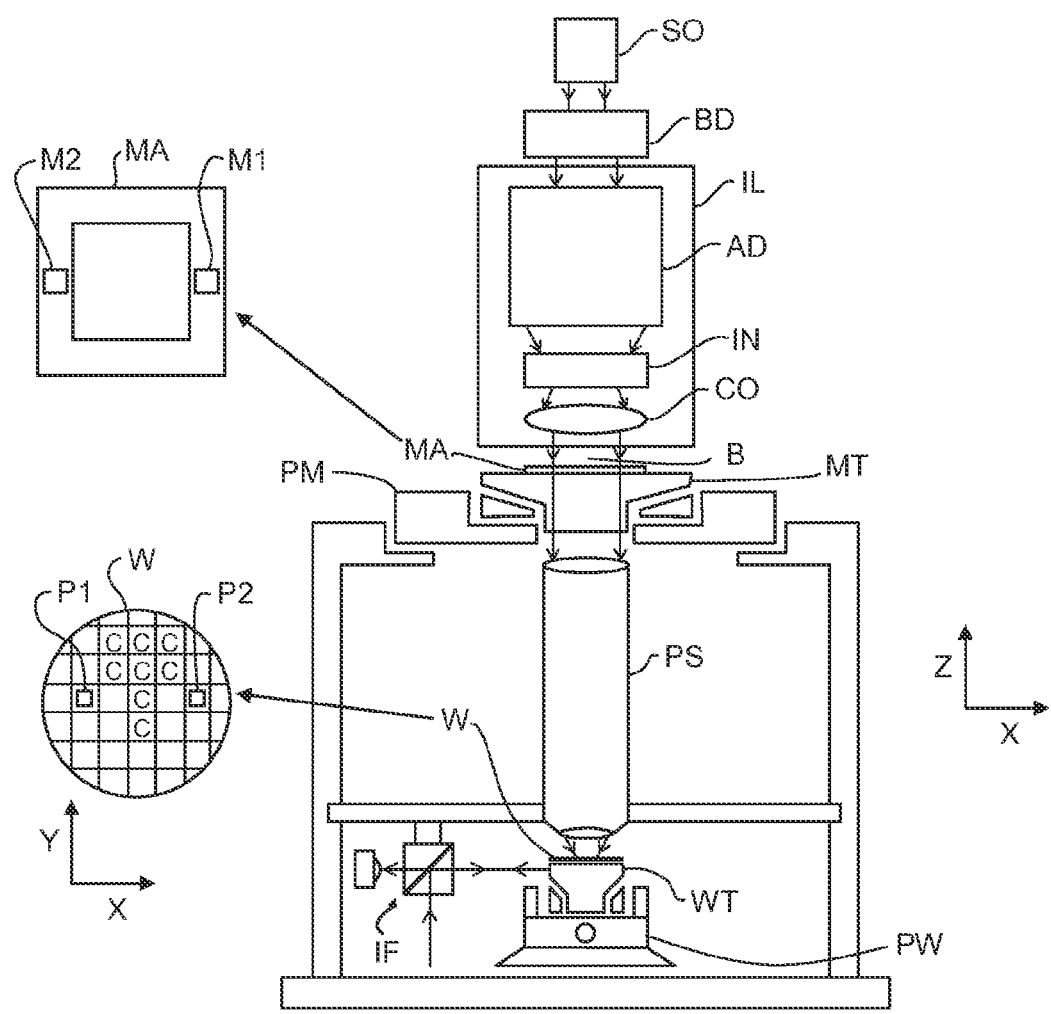
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT supports, i.e. bears the weight of, the patterning device MA. It holds the patterning device MA in a manner that depends on the orientation of the patterning device MA, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so-called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "radiation beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The radiation source SO and the lithographic apparatus may be separate entities, for example when the source is an excimer laser. In such cases, the radiation source SO is not considered to form part of the lithographic apparatus and the radiation beam is passed from the radiation source SO to the illuminator IL with the aid of a beam delivery system BD including, for example, suitable directing mirrors and/or a beam expander. In other cases the radiation source SO may be an integral part of the lithographic apparatus, for example when the source is a mercury lamp. The radiation source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device MA, which is held on the support structure MT, and is patterned by the patterning device. Having traversed the patterning device MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions C (these are known as scribe-lane alignment marks). Similarly, in situations in which more than one die is provided on the patterning device MA, the mask alignment marks M1, M2 may be located between the dies.

The depicted apparatus could be used in at least one of the following modes:
1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the support structure MT and the substrate table WT are scanned synchronously while a pattern imparted to the radiation beam is projected onto a target portion C (i.e. a single dynamic exposure). The velocity and direction of the substrate table WT or "substrate support" relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed, and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above-described modes of use or entirely different modes of use may also be employed.

Figure 2:
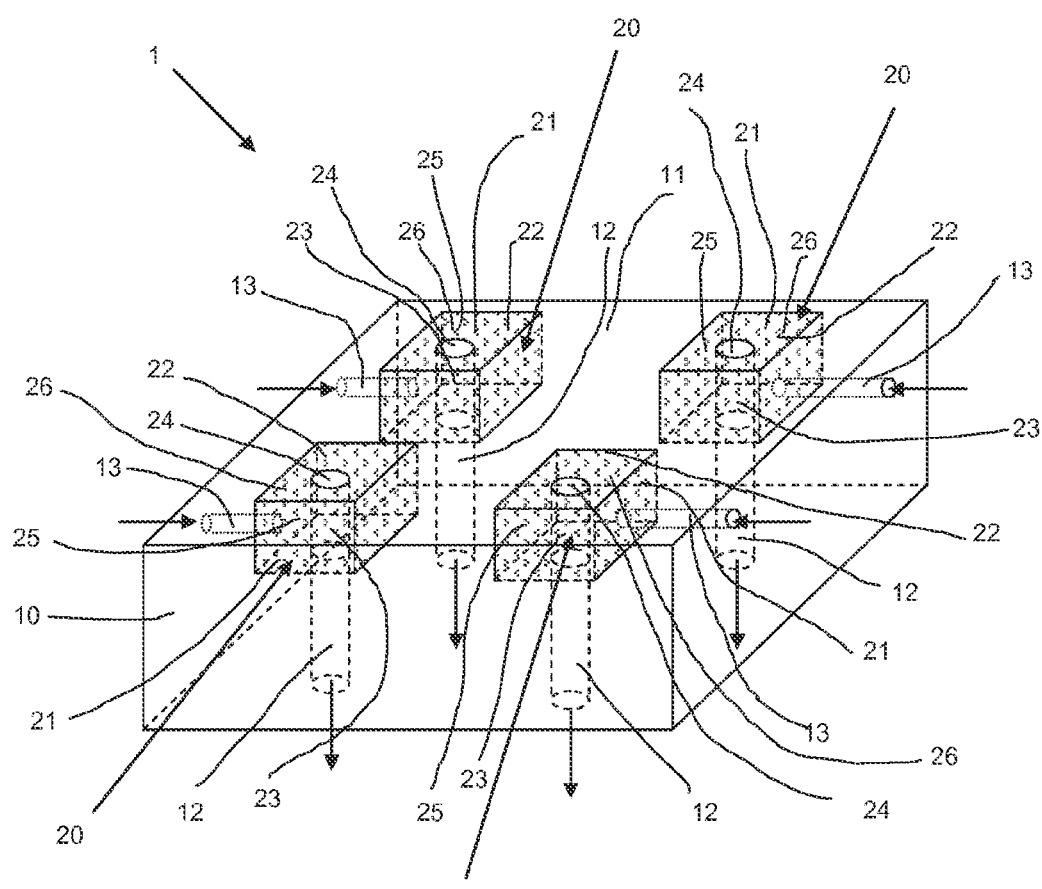
FIG. 2 schematically shows a first embodiment of a system according to the invention, FIG. 3 schematically shows a further embodiment of the system according to the invention, FIG. 4 schematically shows a further embodiment of the system according to the invention, FIG. 5 schematically shows a side view of an example of an object table of stage system of a lithographic apparatus, FIG. 6 schematically shows an example of an air bearing device as can be used in the embodiment of FIG. 5, FIG. 7 schematically shows a variant of a stage system according to the invention.
Figure 2:
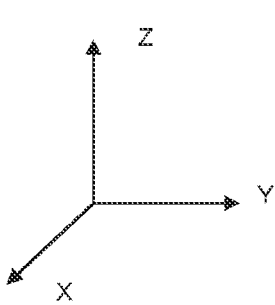

FIG. 2 shows a first embodiment of a system 1 according to the invention. The system 1 can for example be a stage system.

The system 1 as shown in FIG. 2 comprises member 10, which has a surface 11. In this example, the surface 11 is the top surface of member 10. The member 10 may for example be an object table of a stage system.

The member 10 is provided with a plurality of air bearing devices 20. Each air bearing device 20 comprises an air bearing body 21, which has a free surface 22. The free surface 22 is not covered by other physical components of the system. In this embodiment, it forms part of the outer surface of the member 10. In use, and in particular after an optional clamping the object on the member 10, the free surface 22 may be covered by the object that is supported on the member 10. In the example of FIG. 2, the free surfaces 22 of the air bearing bodies 21 are arranged flush with the surface 11 of the member 10, but this is not necessary. In FIG. 2, four air bearing devices are provided, but alternatively any other number of air bearing devices may be provided, in particular two or more.

Each air bearing device 20 further comprises a primary channel 23 which extends through the air bearing body 21. The primary channel 23 has an inlet opening 24 in the free surface 22.

Each air bearing device 20 further comprises a secondary channel system 25 which extends through the air bearing body 21. The secondary channel system 25 has a plurality of discharge openings 26 in the free surface 22 of the air bearing body 21. For reasons of clarity, only a few discharge openings are provided with a reference numeral in FIG. 2. The secondary channel system 25 may have only one discharge opening 26 in the free surface 22 of the air bearing body 21.

In the example shown in FIG. 2, the air bearing body 21 comprises a porous material having interconnected cavities. The secondary channel system 25 is formed by the interconnected cavities in the porous material. The porous material is for example a sintered ceramic material, e.g. SiSiC. Optionally, the faces of the porous material through which no pressurised gas should escape are sealed.

In an alternative embodiment, not shown in the drawing, the secondary channel system 25 in the air bearing body may be formed by channels that are for example machined, e.g. drilled, or etched into the air bearing body.

Preferably, the primary channel 23 is connectable to a source of sub-atmospheric pressure, and the secondary channel system 25 is connectable to a source of pressurised gas. In use, when an object is arranged on or above the surface 11, a pressurised gas can be supplied between the object and the surface 11 and/or between the object and the free surfaces 22, via the discharge openings 26 of the secondary channel system 25. At the same time, a sub-atmospheric pressure is provided at the inlet 24 of the primary channel 23. The pressurised gas pushes the object away from the surface 11, while the sub-atmospheric pressure pulls the object towards surface 11. The balance between the pushing force that the pressurised gas exerts on the object and the pulling force that the sub-atmospheric pressure exerts on the object allows to position the object in z-direction relative to the surface 11, which surface 11 extends in the x-y plane.

The flow resistance in the secondary channel 25 system is higher than the flow resistance in the primary channel 23. This stabilizes the system, because the higher flow resistance prevents that a force in z-direction, for example caused by tilting of the object around the x-axis or y-axis, forces the pressurised air back into the secondary channel system 25. If pressurised gas would be forced back into the secondary channel system, the balance between the pushing force and the pulling force would be disturbed (at least temporarily), making the system unstable. It even may result in that the object hits the surface 11 before the balance between the pushing force and the pulling force is re-established. This is called "hammering" and is not desired. In addition, the feature that the flow resistance in the secondary channel system 25 is higher than the flow resistance in the primary channel 23 results in a high tilt stiffness of the system. Preferably, the flow resistance in the secondary channel 25 system is also higher than the flow resistance in the gap between the free surface 22 and the object to be positioned.

So, the flow resistance in the secondary channel system 25 being higher than the flow resistance in the primary channel 23 increases the stability and the reliability of the system.

Optionally, the member 10 may comprise channels 12 to connect the primary channel 23 of the air bearing device 20 to a source of sub-atmospheric pressure and further channels 13 to connect the secondary channel system 25 of the air bearing device 20 to a source of pressurised gas.

In the example of FIG. 2, in the air bearing devices 20 the discharge openings 26 of the secondary channel system 25 surround the inlet opening 24 of the primary channel 23. This provides further stability to the system, because the pushing force exerted by the pressurised gas is distributed over a relatively large area, often evenly distributed over this area. In addition, pushing forces on opposite sides of the inlet opening 24 of the primary channel 23 may counteract each other, which also further stabilises the system. This results in a high tilt stiffness of the system. This effect is even more substantial when a porous material is used for the air bearing body, because of the large number of discharge openings 26 in such an embodiment.

In a variant of the embodiment of FIG. 2, the system further comprises a sub-atmospheric pressure source which is in fluid communication with the primary channel 23 of at least one air bearing device 20. Alternatively or in addition, in this variant, the system further comprises a source of pressurised gas which is in fluid communication with the secondary channel system 25 of at least one air bearing device 20.

Figure 3:
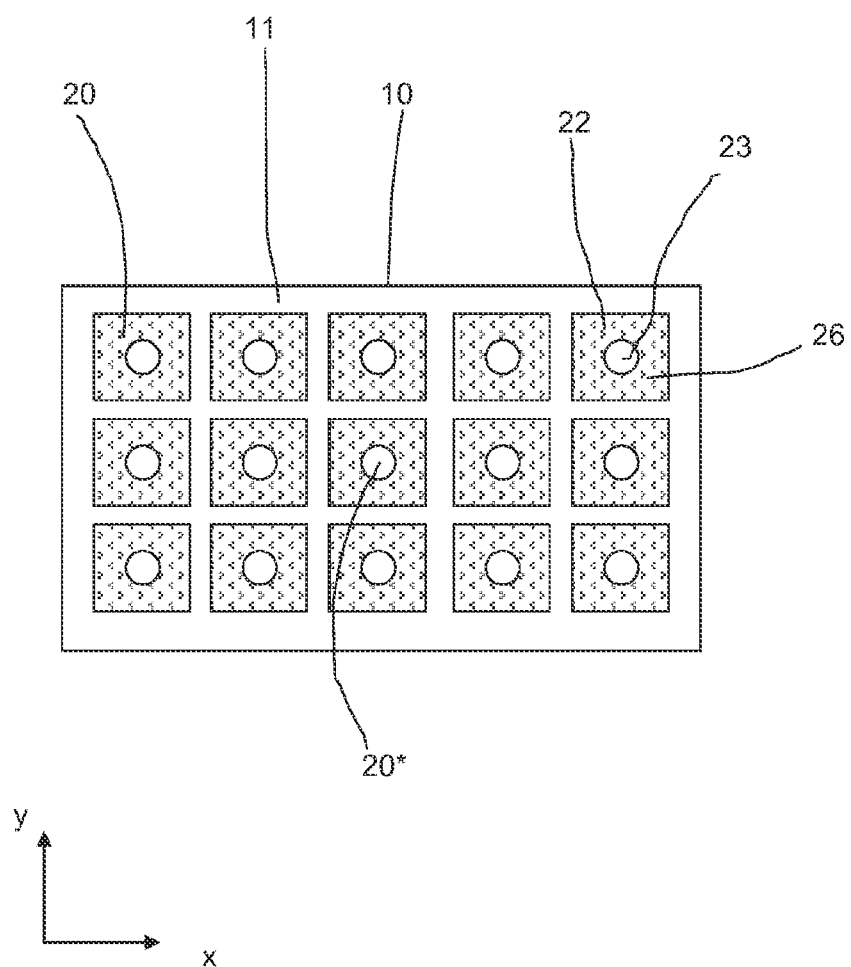

FIG. 3 schematically shows a further embodiment of the system according to the invention.

Figure 6:
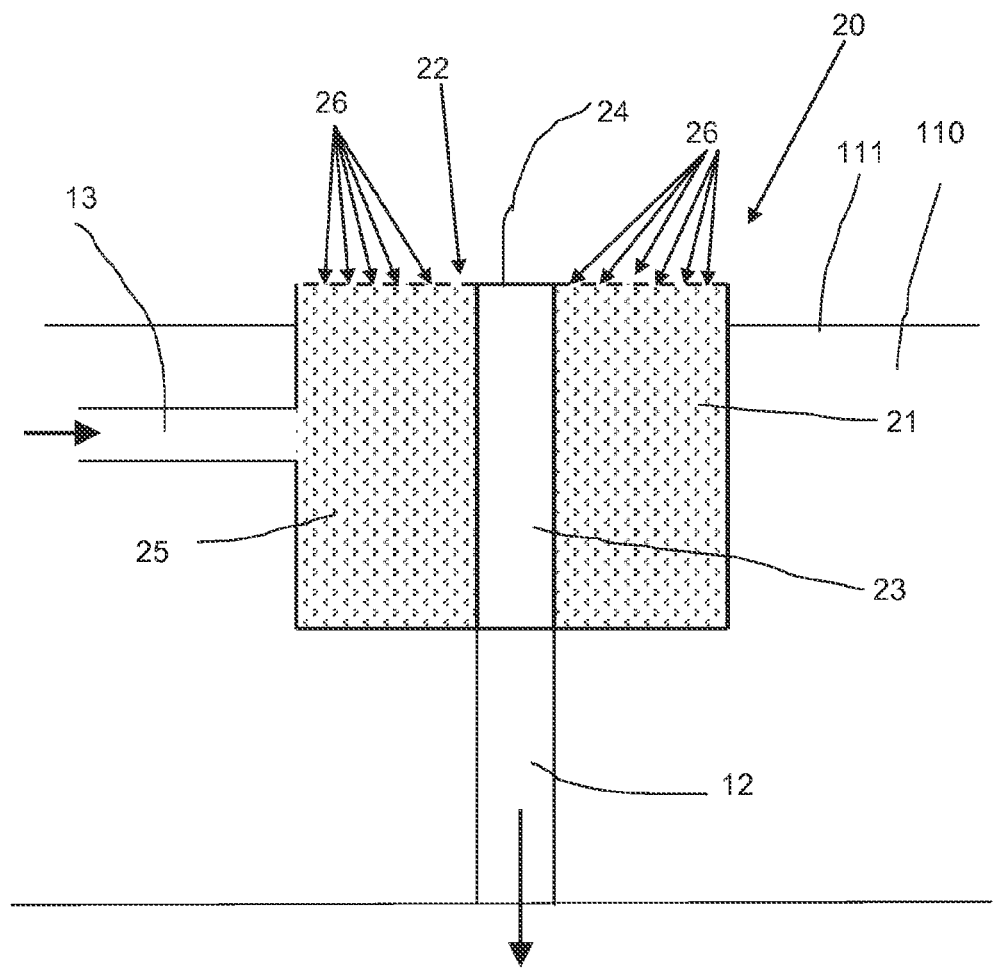

In the embodiment of FIG. 3, the member 10 is provided with a two-dimensional array of air bearing devices 20. In this example, all air bearing devices 20 are identical, but this is not necessary. The air bearing devices 20 in the embodiment of FIG. 3 are for example the same as the air bearing devices 20 as shown in FIG. 2 or as shown in FIG. 6. Again, the member 10 may for example be an object table of a stage system or member comprising a guide surface.

In the embodiment of FIG. 3, the air bearing devices 20 are arranged in a rectangular grid. They are distributed over the surface 11 of the member 10, so they can act locally on an object that is present on or above the member 10. This allows not only to position the object, but also to change the shape of the object. For example, it is possible to correct warp, concavity, convexity, or another low order Zernike shape, or local deformation or other deviations from the flat shape of the object.

In the embodiment of FIG. 3, an air bearing device 20* is provided at the centre of the member 10. This further increases the stability of the system, as the actions of air bearing devices 20 on opposite sides of the centre of the member 10 may counteract each other.

Figure 4:
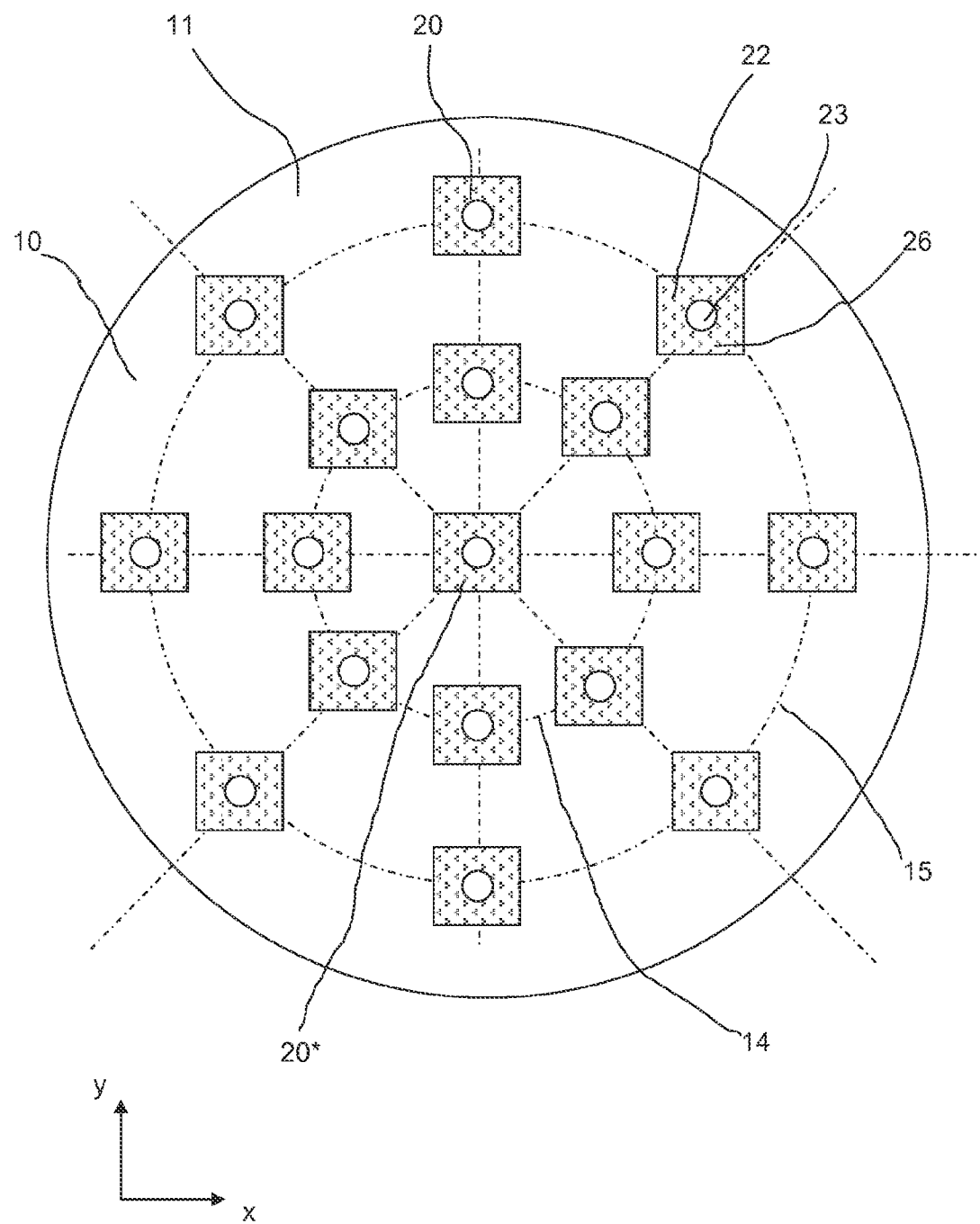

FIG. 4 schematically shows a further embodiment of the system according to the invention.

In the embodiment of FIG. 4, the member 10 is provided with an array of air bearing devices 20. In this example, all air bearing devices 20 are identical, but this is not necessary. The air bearing devices 20 in the embodiment of FIG. 4 are for example the same as the air bearing devices 20 as shown in FIG. 2 or as shown in FIG. 6. Again, the member 10 may for example be an object table of a stage system or member comprising a guide surface.

In the embodiment of FIG. 4, the air bearing devices 20 are arranged in a polar grid. They are arranged on lines meeting in the centre of the polar grid. In the example of FIG. 4, the air bearing devices are arranged in concentric circles around the centre of the polar grid. So, a number of air bearing devices 20 has the same distance to the centre of the polar grid.

The air bearing devices are distributed over the surface 11 of the member 10, so they can act locally on an object that is present on or above the member 10. This allows not only to position the object, but also to change the shape of the object. For example, it is possible to correct warp, concavity, convexity, or another low order Zernike shape, local deformation or other deviations from the flat shape of the object.

In the embodiment of FIG. 4, an air bearing device 20* is provided at the centre of the member 10. This further increases the stability of the system, as the actions of air bearing devices 20 on opposite sides of the centre of the member 10 may counteract each other.

In FIGS. 2, 3 and 4, the air bearing bodies 21 have a rectangular free surface 22 and are generally box shaped. Alternatively, other shapes are possible, for example cylindrical air bearing bodies, e.g. with a circular or elliptical free surface.

Optionally, in any of the embodiments of the FIGS. 2, 3 and 4, the plurality of air bearing devices 20 is adapted to change the shape of an object which is to be arranged on the member 10 by controlling the pressure and/or gas flow rate at the inlet opening 24 of a primary channel 23 and/or the pressure and/or gas flow rate at the discharge openings 26 of the secondary channel system 25 of at least one air bearing device 20.

Optionally, the control of the pressure and/or gas flow rate at the inlet 24 of a primary channel 23 and/or the pressure and/or gas flow rate at the discharge openings 26 of a secondary channel system 25 of at least one air bearing device 20 is based on the expected and/or measured shape of the object.

In a variant, any of the embodiments of the FIGS. 2, 3 and/or 4 further comprises a measurement system which is adapted to obtain shape data of an object arranged on or above the member 10 during activation of the air bearing devices 20. The measurement system optionally comprises capacitive sensors, and/or inductive sensors and/or an interferometer. Optionally, one or more parts of the measurement system are arranged on or in the member 10, so that measurement of the object can take place while the object is arranged at or above the member 10. Alternatively or in addition, the measurement system may be arranged such that measurement of the object takes place before the object is arranged at or above the member 10.

In this variant, the embodiment further comprises a control device for controlling the pressure and/or gas flow rate at the inlet opening 24 of a primary channel 23 and/or the pressure and/or gas flow rate at the discharge openings 26 of a secondary channel system 25 of at least one air bearing device 20. The control device is adapted to receive the shape data from the measurement system and to control the pressure and/or gas flow rate at the inlet opening 24 of the primary channel 23 and/or the pressure and/or gas flow rate at the discharge openings 26 of the secondary channel system 25 of the at least one air bearing device 20, based on the received shape data.

Optionally, in any of the embodiments of the FIGS. 2, 3 and/or 4, the plurality of air bearing devices comprises multiple air bearing groups. Each air bearing group comprises at least one air bearing device 20. For example, in the embodiment of FIG. 3, each row of air bearing devices 20 extending in the x-direction may form an air bearing group, or each row of air bearing devices 20 extending in the y-direction may form an air bearing group. In the embodiment shown in FIG. 4, for example the air bearing devices 20 that have the same distance to the centre of the polar grid (so the air bearing devices on the same circle) may form an air bearing group.

Within an air bearing group, the pressure and/or gas flow rate at the inlets of the primary channels is in this embodiment controllable separately from the pressure and/or gas flow rate at the inlet opening of the primary channels in another air bearing group. This allows to control the local forces that are exerted on the object, which allows to change the shape of the object. Optionally, the pressure and/or gas flow rate at the inlet opening of the primary channels is controllable independently from the pressure and/or gas flow rate at the inlet openings of the primary channels in another air bearing group.

Alternatively or in addition, the pressure and/or the gas flow rate at the discharge openings of the secondary channel systems in at least one air bearing group is controllable separately from the pressure and/or gas flow rate at the discharge openings of secondary channel systems in another air bearing group. This allows to control the local forces that are exerted on the object, which allows to change the shape of the object. Optionally, the pressure and/or the gas flow rate at the discharge openings of the secondary channel systems in at least one air bearing group is controllable independently from the pressure and/or gas flow rate at the discharge openings of secondary channel systems in another air bearing group.

The separate control of the pressure and/or flow rate in any of the air bearing groups may lead to difference in pressure and/or flow rate between different air bearing groups, and therewith in differences in the magnitude of the local pulling and/or pushing forces exerted on the object at any given time. Alternatively or in addition, with this feature it is possible to control the timing of the activation of the respective air bearing groups. For example, one air bearing group may be activated only after another air bearing group has been activated.

Activating one air bearing group only after another air bearing group has been activated can be advantageous when the shape of the object on or above the member 10 has to be corrected. For example, if the object is round, but dome-shaped instead of flat, and the embodiment of FIG. 4 is used, it is advantageous to first activate the air bearing device 20\* at the centre of the member 10. When the centre of the object is brought at the desired level above the member 10 by the combined action of the pulling force and pushing forces of the air bearing device 20\* at the centre of the member 10, the air bearing devices 20 at the inner ring 14 are activated. They bring a ring around the centre of the object to desired level above the member 10. The object can move freely in the x-y plane because there is no friction with any mechanical support members, which reduces the internal stresses in the object. After activating the air bearing devices in the inner ring 14, the air bearing devices 20 in the outer ring 15 are activated. They bring an outer ring of the object to desired level above the member 10. This way, the object is flattened and the dome shape is reduced or even made to disappear. After flattening, the object may be clamped or otherwise fixed to or relative to the member 10.

The invention may be applied in a stage system, for example in a stage system such as used in a lithographic apparatus. In that case, the member may be an object table or a substrate table.

So, in a further embodiment, the invention provides a stage system, for positioning an object, which stage system comprises:
an object table adapted to support the object to be positioned, the object table comprising a plurality of air bearing devices, each air bearing device comprising:
an air bearing body, which has a free surface,
a primary channel which extends through the air bearing body and has an inlet opening in the free surface,
a secondary channel system which extends through the air bearing body and which has a plurality of discharge openings in the free surface,
wherein the flow resistance in the secondary channel system is higher than the flow resistance in the primary channel.

The invention allows the object, e.g. a substrate W or a patterning device MA, to be positioned in a direction perpendicular to a surface of the object table prior to clamping or otherwise fixing the object to that surface of the object table. In some embodiments, the invention allows to change or correct the shape of the object before prior to clamping or otherwise fixing the object the object table.

Figure 5:
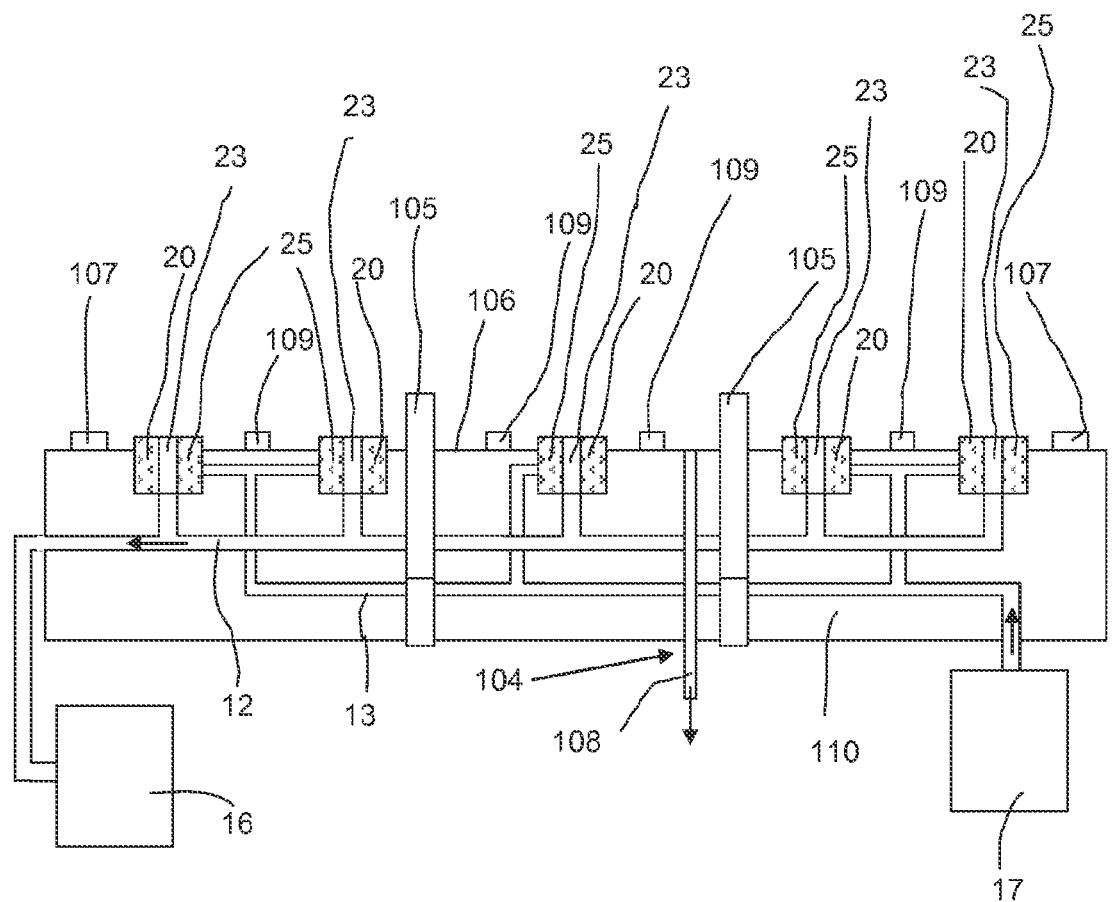

FIG. 5 shows a side view of an example of an object table 110 of stage system of a lithographic apparatus.

The top side of the object table 110 comprises a vacuum clamp 104 to clamp an object, e.g., a substrate W, on the object table 110. The object table 110 further comprises three retractable pins 1055, also known as e-pins, which are movable with respect to the object table between an extended position in which the pins 105 extend from the object table 110 and a retracted position in which the pins 105 are retracted in the object table 110. The retractable pins 105 are movable in a substantially vertical direction, i.e., in a direction substantially perpendicular to a main plane of an object to be supported by the pins. The retractable pins 105 are used for transfer of an object, e.g. a substrate W, between the object table 110 and a robot or any other type of object handler. The retractable pins 105 are provided so that e.g. a gripper of a robot may be placed under the object for supporting the object. When the robot is configured to hold the object at the sides or top, the retractable pins 105 may be omitted. In alternative embodiments any other type of device capable of exerting an attraction force on an object, such as electrostatic, magnetic or electromagnetic clamps may be used.

In this embodiment a robot places an object on the pins 105 which are in the extended position. Then the pins 105 are be moved to the retracted position so that the object comes to rest on the support surface of the object table 110. After an object supported by the object table 110 is for example exposed to a patterned beam of radiation, the object is exchanged for another one. For exchange of the object it is lifted from the object table 110 by the retractable pins 105 which are moved from the retracted position to the extended position. When the retractable pins 105 are in the extended position, the object is taken over by the robot or any other type of object handler.

The vacuum clamp 104 is formed by a recessed surface 106 which is surrounded by a sealing rim 107. A suction conduit 108 is provided to create a low pressure in a vacuum space delimited by the recessed surface 106, the sealing rim 107 and an object placed or to be placed on the object table 110. The suction conduit 108 is connected to a suction pump to draw air, or another gas present in the process environment, out of the vacuum space. The lower pressure provides a vacuum force which draws an object placed within a certain range above the supporting surface towards the object table 110 in order to clamp it to the object table.

In the recessed surface 106 a number of burls 109 are arranged. The top ends of the burls 109 provide support surfaces for an object to be placed on the object table 110. The sealing rim 107 and the top ends of the burls 109 may be arranged in substantially the same plane to provide a substantial flat surface for supporting an object. In an alternative embodiment the sealing rim 107 may be arranged lower than the burls 109, as shown in FIG. 5, or vice versa.

In the object table 110, a plurality of air bearing devices 20 is arranged. These air bearing devices are for example air bearing devices as shown in FIGS. 2, 3 and 4.

Each air bearing device comprises a primary channel 23 which is preferably connected to a source 16 of sub-atmospheric pressure via channel 12.

Each air bearing device further comprises a secondary channel system 25 is formed by interconnected cavities in a porous material. The secondary channel system is preferably connected to a source 17 of pressurised gas via channel 13.

FIG. 6 shows an example of an air bearing device 20 as can be used in the embodiment of FIG. 5.

The object table 110 is provided with a plurality of air bearing devices 20. Each air bearing device 20 comprises an air bearing body 21, which has a free surface 22. The free surface 22 is not covered by other physical components of the system. In use, and in particular after an optional clamping the object on the member 10, the free surface 22 may be covered by the object that is supported on the object table 110. In the example of FIGS. 5 and 6, the free surfaces 22 of the air bearing bodies 21 extend somewhat above the surface 111 of the object table, but alternatively they can be arranged flush with the surface 111 of the object table 110.

Each air bearing device 20 further comprises a primary channel 23 which extends through the air bearing body 21. The primary channel 23 has an inlet opening 24 in the free surface 22.

Each air bearing device further comprises a secondary channel system 25 which extends through the air bearing body 21. The secondary channel system 25 has a plurality of discharge openings 26 in the free surface 22 of the air bearing body 21.

In the example shown in FIGS. 5 and 6, the air bearing body 21 comprises a porous material having interconnected cavities. The secondary channel system 25 is formed by the interconnected cavities in the porous material. The porous material is for example a sintered ceramic material, e.g. SiSiC. Optionally, the faces of the porous material through which no pressurised gas should escape are sealed.

In an alternative embodiment, not shown in the drawing, the secondary channel system 25 in the air bearing body may be formed by channels that are for example machined, e.g. drilled, or etched into the air bearing body.

Preferably, the primary channel 23 is connectable to a source of sub-atmospheric pressure 16, and the secondary channel system 25 is connectable to a source of pressurised gas. In use, when an object is arranged on or above the surface 111, a pressurised gas can be supplied between the object and the surface via the discharge openings 26 of the secondary channel system and/or between the object and the free surfaces 22. At the same time, a sub-atmospheric pressure is provided at the inlet 24 of the primary channel 23. The pressurised gas pushes the object away from the surface 111, while the sub-atmospheric pressure pulls the object towards surface 111. The balance between the pushing force that the pressurised gas exerts on the object and the pulling force that the sub-atmospheric pressure exerts on the object allows to position the object in z-direction relative to the surface 111, which surface 111 extends in the x-y plane.

The flow resistance in the secondary channel 25 system is higher than the flow resistance in the primary channel 23. This stabilises the system, because the higher flow resistance prevents that a force in z-direction, for example caused by tilting of the object around the x-axis or y-axis, forces the pressurised air back into the secondary channel system 25. If pressurised gas would be forced back into the secondary channel system, the balance between the pushing force and the pulling force would be disturbed (at least temporarily), making the system unstable. It even may result in that the object hits the surface 111 before the balance between the pushing force and the pulling force is re-established. This is called "hammering" and is not desired. In addition, the feature that the flow resistance in the secondary channel 25 system is higher than the flow resistance in the primary channel 23 results in a high tilt stiffness of the system. Preferably, the flow resistance in the secondary channel 25 system is also higher than the flow resistance in the gap between the free surface 22 and the object to be positioned.

So, the flow resistance in the secondary channel 25 system being higher than the flow resistance in the primary channel 23 increases the stability and the reliability of the system.

In this embodiment, the object table 110 may comprise channels 12 which allow to connect the primary channel 23 of the air bearing device 20 to the source of sub-atmospheric pressure and further channels 13 to connect the secondary channel system 25 of the air bearing device 20 to the source of pressurised gas.

In the example of FIGS. 5 and 6, in the air bearing devices 20 the discharge openings 26 of the secondary channel system 25 surround the inlet opening 24 of the primary channel 23. This provides further stability to the system, because the pushing force exerted by the pressurised gas is distributed over a relatively large area, often even distributed evenly over this area. In addition, pushing forces on opposite sides of the inlet opening 24 of the primary channel 23 may counteract each other, which also further stabilises the system. This furthermore results in a high tilt stiffness of the system. This effect is even more substantial when a porous material is used for the air bearing body, because of the large number of discharge openings 26 in such an embodiment.

In a variant of the embodiment of FIGS. 5 and 6, the system further comprises a sub-atmospheric pressure source 16 which is in fluid communication with the primary channel 23 of at least one air bearing device 20. Alternatively or in addition, in this variant, the system further comprises a source 17 of pressurised gas which is in fluid communication with the secondary channel system 25 of at least one air bearing device 20.

Optionally, in the embodiment of FIGS. 5 and 6, the air bearing devices 20 are arranged in a rectangular grid, for example as shown in FIG. 3, or alternatively in a polar grid, for example as shown in FIG. 4. The use of arrangements of FIG. 3 or FIG. 4 in the stage system of FIGS. 5 and/or 6, allows to change the shape of the object. For example it is possible to correct warp, concavity, convexity, or another low order Zernike shape, or local deformation or other deviations from the flat shape of the object.

In the embodiment shown in FIGS. 5 and 6, the air bearing bodies 21 have a rectangular free surface 22 and are generally box shaped. Alternatively, other shapes are possible, for example cylindrical air bearing bodies, e.g. with a circular or elliptical free surface.

Optionally, the embodiment of the FIGS. 5 and 6, the plurality of air bearing devices 20 is adapted to change the shape of an object which is to be arranged on the object table 110 by controlling the pressure and/or gas flow rate at the inlet opening 24 of a primary channel 23 and/or the pressure and/or gas flow rate at the discharge openings 26 of the secondary channel system 25 of at least one air bearing device 20.

Optionally, the control of the pressure and/or gas flow rate at the inlet 24 of a primary channel 23 and/or the pressure and/or gas flow rate at the discharge openings 26 of a secondary channel system 25 of at least one air bearing device 20 is based on the expected and/or measured shape of the object.

In a variant, the embodiment of the FIGS. 5 and 6 further comprises a measurement system which is adapted to obtain shape data of an object arranged on or above the object table 110 during activation of the air bearing devices 20. The measurement system optionally comprises capacitive sensors, and/or inductive sensors and/or an interferometer. Optionally, one or more parts of the measurement system are arranged on or in the object table 110, so that measurement of the object can take place while the object is arranged at or above the object table 110. Alternatively or in addition, the measurement system may be arranged such that measurement of the object takes place before the object is arranged at or above the object table 110.

In this variant, the embodiment further comprises a control device for controlling the pressure and/or gas flow rate at the inlet opening 24 of a primary channel 23 and/or the pressure and/or gas flow rate at the discharge openings 26 of a secondary channel system 25 of at least one air bearing device 20. The control device is adapted to receive the shape data from the measurement system and to control the pressure and/or gas flow rate at the inlet opening 24 of the primary channel 23 and/or the pressure and/or gas flow rate at the discharge openings 26 of the secondary channel system 25 of the at least one air bearing device 20, based on the received shape data.

Optionally, in the embodiment of the FIGS. 5 and 6, the plurality of air bearing devices comprises multiple air bearing groups. Each air bearing group comprises at least one air bearing device 20.

Within an air bearing group, the pressure and/or gas flow rate at the inlets of the primary channels is in this embodiment controllable separately from the pressure and/or gas flow rate at the inlet opening of the primary channels in another air bearing group. This allows to control the local forces that are exerted on the object, which allows to change the shape of the object. Optionally, the pressure and/or gas flow rate at the inlet opening of the primary channels is controllable independently from the pressure and/or gas flow rate at the inlet openings of the primary channels in another air bearing group.

Alternatively or in addition, the pressure and/or the gas flow rate at the discharge openings of the secondary channel systems in at least one air bearing group is controllable separately from the pressure and/or gas flow rate at the discharge openings of secondary channel systems in another air bearing group. This allows to control the local forces that are exerted on the object, which allows to change the shape of the object. Optionally, the pressure and/or the gas flow rate at the discharge openings of the secondary channel systems in at least one air bearing group is controllable independently from the pressure and/or gas flow rate at the discharge openings of secondary channel systems in another air bearing group.

The separate control of the pressure and/or flow rate in any of the air bearing groups may lead to differences in pressure and/or flow rate between different air bearing groups, and therewith in differences in the magnitude of the local pulling and/or pushing forces exerted on the object at any given time. Alternatively or in addition, with this feature it is possible to control the timing of the activation of the respective air bearing groups. For example, one air bearing group may be activated only after another air bearing group has been activated.

Activating one air bearing group only after another air bearing group has been activated can be advantageous when the shape of the object on or above the member 10 has to be corrected. For example, if the object is round, but dome-shaped instead of flat, and the configuration of FIG. 4 is used in the embodiment of FIGS. 5 and 6, it is advantageous to first activate the air bearing device 20* at the centre of the object table 110. When the centre of the object is brought at the desired level above the object table 110 by the combined action of the pulling force and pushing forces of the air bearing device 20* at the centre of the object table 110, the air bearing devices 20 at the inner ring 14 are activated. They bring a ring around the centre of the object to desired level above the object table 110. The object can move freely in the x-y plane because there is no friction with any mechanical support members, which reduces the internal stresses in the object. After activating the air bearing devices in the inner ring 14, the air bearing devices 20 in the outer ring 15 are activated. They bring an outer ring of the object to desired level above the object table 110. This way, the object is flattened and the dome shape is reduced or even made to disappear. After flattening, the object may be clamped or otherwise fixed to or relative to the object table 110.

Figure 7:
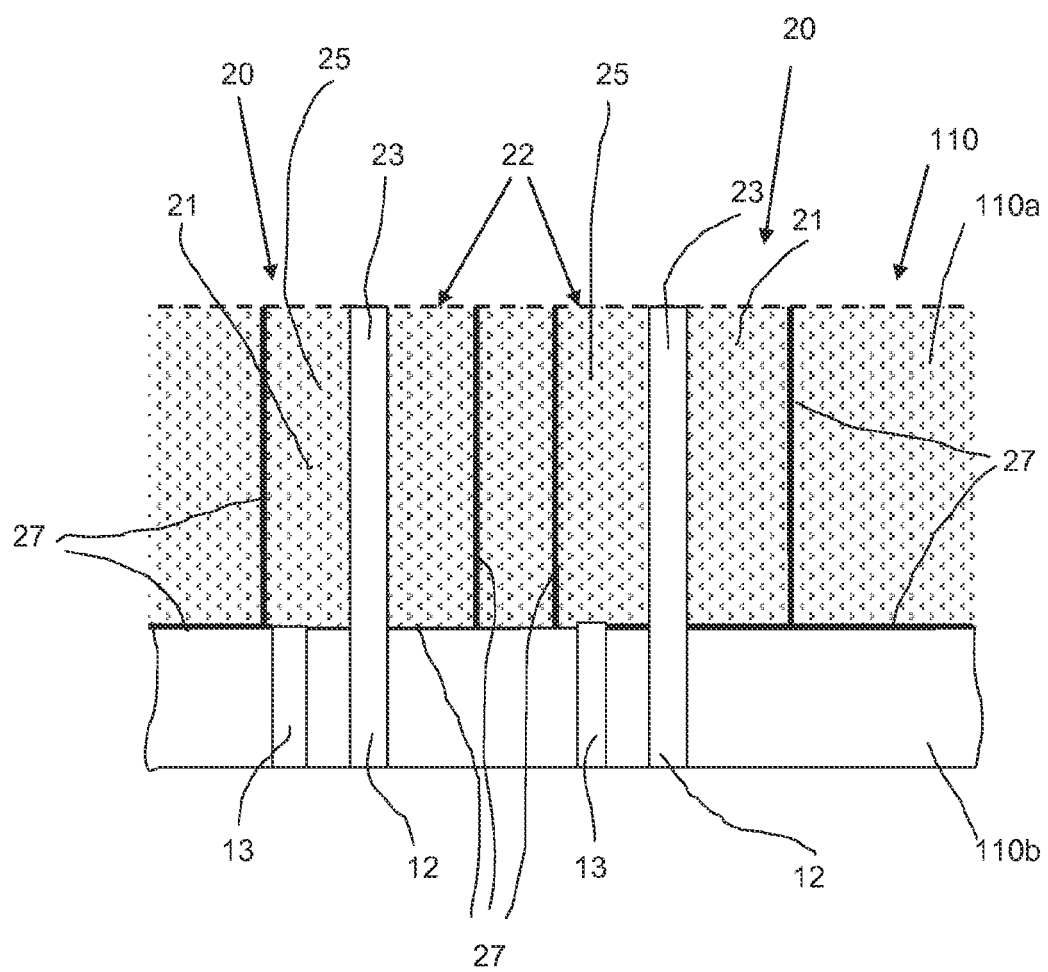

FIG. 7 shows a variant of a stage system according to the invention.

In the variant of the object table 110 comprises a porous zone 110a. Optionally, also a non-porous zone 110b is present. At least one air bearing body 21 forms part of the porous zone 110a of the object table 110.

In the embodiment shown in FIG. 7, impermeable elements 27 have been provided in order to avoid leaking of pressurised gas when the porous air bearing bodies 21 have been connected to a source of pressurised gas.

For example, the object table 110 is in this variant made from a sintered ceramic, e.g. from SiSiC. After sintering, the entire object table 110 is porous. Then, a sealant substance is allowed to fill the interconnected cavities, e.g. by arranging the lower part from the object table in a bath of liquid sealant, which enters the interconnected cavities due to capillary action. This process is however stopped before the entire object table is saturated. Only a lower part of the object table 110 is filled with the sealant. This lower part forms the non-porous zone 110*b*. The impermeable elements 27 may be formed by locally injecting sealant.

In the described embodiments, the air bearing device 20 is arranged to discharge air via the discharge opening 26. The discharged air may have the same composition as the ambient air or may have a different composition than the ambient air. For example, the humidity of the discharged air may be different, for example lower, than that of the ambient air. The discharged air may comprise any type of suitable gas, such as nitrogen or carbon dioxide. It is clear to the skilled person that the term 'air bearing' may be interpreted as a more general term 'gas bearing.'

In an embodiment, the invention further provides a method of positioning an object, which method comprises the following steps:
  arranging an object on or above the object table of a stage system according to the invention,
  making pressurized gas flow out of the discharge openings of the secondary channel systems of at least one air bearing device of the stage system according to the invention while simultaneously applying a sub-atmospheric pressure to the inlet of the primary channel of at least one air bearing device of the stage system according to the invention, thereby keeping the object in a position spaced apart from the object table in a direction perpendicular to the object table.

In a possible embodiment of the stage system according to the invention, the plurality of air bearing devices comprises multiple air bearing groups each comprising at least one air bearing device, wherein the pressure and/or gas flow rate at the inlet opening of the primary channel or at the inlet openings of the primary channels, respectively, in at least one air bearing group of the stage system is controllable separately from the pressure and/or gas flow rate at the inlet opening of the primary channel or primary channels, respectively, in another air bearing group in the stage system.

In a possible embodiment of the method according to the invention, such an embodiment of the stage system is used. In this embodiment of the method according to the invention, the pressure and/or gas flow rate at the inlet of the primary channel or at the inlets of the primary channels, respectively, in at least one air bearing group of the stage system is controlled separately from the pressure and/or gas flow rate at the inlet of the primary channel or primary channels, respectively, in another air bearing group of the stage system so as to control the shape of the object.

In a possible embodiment of the stage system according to the invention, the plurality of air bearing devices comprises multiple air bearing groups each comprising at least one air bearing device, wherein the pressure and/or the gas flow rate at the discharge openings of the secondary channel system or secondary channel systems, respectively, in at least one air bearing group of the stage system is controllable separately from the pressure and/or gas flow rate at the discharge openings of the secondary channel system or secondary channel systems, respectively, in another air bearing group of the stage system.

In a possible embodiment of the method according to the invention, such an embodiment of the stage system is used. In this embodiment of the method according to the invention, the pressure and/or the gas flow rate of at the discharge openings of the secondary channel system or secondary channel systems, respectively, in at least one air bearing group of the stage system, is controlled separately from the pressure and/or gas flow rate at the discharge of the secondary channel system or secondary channel systems, respectively, in another air bearing group of the stage system so as to control the shape of the object.

In a possible embodiment of the method according to the invention, the method further comprises changing the shape of the object which is to be arranged on the object table by controlling the pressure and/or gas flow rate at the inlet opening of a primary channel and/or the pressure and/or gas flow rate at the discharge openings of the secondary channel system of at least one air bearing device.

Optionally, this controlling of the pressure and/or gas flow rate at the inlet opening of a primary channel and/or of the pressure and/or gas flow rate at the discharge openings of the secondary channel system is based on an expected and/or measured shape of the object.

In another embodiment of the invention, there is provided a system for positioning an object, which system comprises:
  a member comprising a plurality of air bearing devices, each air bearing device comprising:
  an air bearing body, which has a free surface,
  a primary channel which extends through the air bearing body and has an inlet opening in the free surface,
  a secondary channel system which extends through the air bearing body and which has a plurality of discharge openings in the free surface,
  wherein the flow resistance in the secondary channel system is higher than the flow resistance in the primary channel,
  wherein the plurality of air bearing devices is adapted to change the shape of an object which is to be arranged on the object table by controlling the pressure and/or gas flow rate at the inlet opening of a primary channel and/or the pressure and/or gas flow rate at the discharge openings of the secondary channel system of at least one air bearing device.

Optionally, in this embodiment, the control of the pressure and/or gas flow rate at the inlet of a primary channel and/or the pressure and/or gas flow rate at the discharge openings of a secondary channel system of at least one air bearing device is based on the expected and/or measured shape of the object.

Optionally, in this embodiment, the system further comprises a measurement system which is adapted to obtain shape data of an object arranged on the object table during activation of the air bearing devices, and further comprises a control device for controlling the pressure and/or gas flow rate at the inlet of a primary channel and/or the pressure and/or gas flow rate at the discharge openings of a secondary channel system of at least one air bearing device. The control device is adapted to receive the shape data from the measurement system and to control the pressure and/or gas flow rate at the inlet opening of the primary channel and/or the pressure and/or gas flow rate at the discharge opening of the secondary channel system of the at least one air bearing device based on the received shape data.

In another embodiment, there is provided a method for positioning an object, the method comprising:

arranging an object on or above the surface of a member of a system, which member comprises a plurality of air bearing devices, wherein each air bearing device comprises:

an air bearing body, which has a free surface, a primary channel which extends through the air bearing body and has an inlet opening in the free surface, a secondary channel system which extends through the air bearing body and which has a plurality of discharge openings in the free surface, wherein the flow resistance in the secondary channel system is higher than the flow resistance in the primary channel, making pressurized gas flow out of the discharge openings of the secondary channel systems of at least one air bearing device while simultaneously applying a sub-atmospheric pressure to the inlet of the primary channel of at least one air bearing device, thereby keeping the object in a position spaced apart from the member in a direction perpendicular to the surface of the member, and changing the shape of the object which is to be arranged on the object table by controlling the pressure and/or gas flow rate at the inlet opening of a primary channel and/or the pressure and/or gas flow rate at the discharge openings of the secondary channel system of at least one air bearing device.

Optionally, this controlling of the pressure and/or gas flow rate at the inlet opening of a primary channel and/or of the pressure and/or gas flow rate at the discharge openings of the secondary channel system is based on an expected and/or measured shape of the object.

In an embodiment, there is provided a stage system for positioning an object, the stage system comprising an object table adapted to support the object to be positioned, the object table having a plurality of air bearing devices, wherein each air bearing device comprises: an air bearing body having a free surface, a primary channel which extends through the air bearing body and has an inlet opening in the free surface, and a secondary channel system which extends through the air bearing body and which has a discharge opening in the free surface, wherein the flow resistance in the secondary channel system is higher than the flow resistance in the primary channel.

In an embodiment, the air bearing body comprises a porous material comprising interconnected cavities, and the secondary channel system is formed by the interconnected cavities. In an embodiment, the stage system comprises a plurality of discharge openings, wherein the plurality of discharge openings surround the inlet opening of the primary channel. In an embodiment, the plurality of air bearing devices comprises multiple air bearing groups each group comprising at least one air bearing device, wherein the pressure and/or gas flow rate at the one or more inlet openings of the one or more primary channels in at least one air bearing group is controllable separately from the pressure and/or gas flow rate at the one or more inlet openings of the one of more primary channels in another air bearing group. In an embodiment, the plurality of air bearing devices comprises multiple air bearing groups each group comprising at least one air bearing device, wherein the pressure and/or the gas flow rate at the one or more discharge openings of the one or more secondary channel systems in at least one air bearing group is controllable separately from the pressure and/or gas flow rate at the one or more discharge openings of the one or more secondary channel systems in another air bearing group. In an embodiment, the plurality of air bearing devices is adapted to change a shape of an object which is to be arranged on the object table by controlling the pressure and/or gas flow rate at the inlet opening of a primary channel and/or the pressure and/or gas flow rate at the discharge opening of the secondary channel system of at least one air bearing device. In an embodiment, the control of the pressure and/or gas flow rate at the inlet of a primary channel and/or the pressure and/or gas flow rate at the discharge opening of a secondary channel system of at least one air bearing device is based on an expected and/or measured shape of the object. In an embodiment, the stage system further comprises a measurement system which is adapted to obtain shape data of the object when arranged on the object table during activation of the air bearing devices, and a control device for controlling the pressure and/or gas flow rate at the inlet of a primary channel and/or the pressure and/or gas flow rate at the discharge opening of a secondary channel system of at least one air bearing device, wherein the control device is adapted to receive the shape data from the measurement system and to control the pressure and/or gas flow rate at the inlet opening of the primary channel and/or the pressure and/or gas flow rate at the discharge opening of the secondary channel system of the at least one air bearing device based on the received shape data. In an embodiment, the object table comprises a porous zone, and at least one air bearing body forms part of the porous zone of the object table.

In an embodiment, there is provided a lithographic apparatus arranged to transfer a pattern from a patterning device onto a substrate, wherein the lithographic apparatus comprises a stage system as described herein.

In an embodiment, there is provided a lithographic apparatus comprising: an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, wherein the substrate table has a plurality of air bearing devices, each air bearing device comprising: an air bearing body having a free surface, a primary channel which extends through the air bearing body and has an inlet opening in the free surface, and a secondary channel system which extends through the air bearing body and which has a discharge opening in the free surface, wherein the flow resistance in the secondary channel system is higher than the flow resistance in the primary channel.

In an embodiment, there is provided a device manufacturing method comprising transferring a pattern from a patterning device onto a substrate, wherein use is made of a stage system as described herein.

In an embodiment, there is provided a method for positioning an object, the method comprising: arranging an object on or above the object table of a stage system as described herein; and making pressurized gas flow out of the discharge opening of the secondary channel system of at least one air bearing device of the stage system while simultaneously applying a sub-atmospheric pressure to the inlet of the primary channel of at least one air bearing device of the stage system thereby keeping the object in a position spaced apart from the object table in a direction perpendicular to the object table.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed:

1. An object table adapted to support an object to be positioned, the object table comprising:
   a clamping device to clamp the object;
   a plurality of burls configured to provide a support surface for the object; and
   a plurality of gas bearing devices arranged to support the object prior to clamping of the object on the burls, wherein each gas bearing device is in fluid communication with a source of sub-atmospheric pressure configured to pull the object towards the surface and a source of pressurized gas configured to push the object away from the surface such that a balance between the pushing force that the pressurized gas exerts on the object and the pulling force that the sub-atmospheric pressure exerts on the object allows the object to be positioned in a direction perpendicular to the surface.

2. The table according to claim 1, wherein each gas bearing device comprises a porous material comprising interconnected cavities.

3. The table according to claim 1, wherein the plurality of gas bearing devices is adapted to change a shape of the object by controlling the pressure and/or gas flow rate at an inlet opening and/or the pressure and/or gas flow rate at a discharge opening, of at least one gas bearing device.

4. The table according to claim 3, wherein control of the pressure and/or gas flow rate is based on an expected and/or measured shape of the object.

5. The table according to claim 4, further comprising:
   a measurement system configured to obtain shape data of the object when arranged on the object table during activation of the gas bearing devices, and
   a control device configured to receive the shape data from the measurement system and to control the pressure and/or gas flow rate based on the received shape data.

6. A lithographic apparatus arranged to transfer a pattern from a patterning device onto a substrate, wherein the lithographic apparatus comprises the table according to claim 1.

7. The table according to claim 1, wherein at least one of the gas bearing devices comprises:
   a gas bearing body having a free surface,
   a primary channel which extends through the gas bearing body and has an inlet opening in the free surface, and
   a secondary channel system which extends through the gas bearing body and has a discharge opening in the free surface.

8. The table according to claim 7, wherein the primary channel is in fluid communication with the source of sub-atmospheric pressure and the secondary channel system is in fluid communication with the source of pressurized gas.

9. The table according to claim 7, comprising a plurality of discharge openings surrounding the inlet opening.

10. The table according to claim 7, wherein the flow resistance in the secondary channel system is higher than the flow resistance in the primary channel.

11. The table according to claim 7, wherein the flow resistance in the secondary channel system is higher than the flow resistance in the gap between the free surface and the object.

12. An object table configured to support an object, the object table comprising:
    a clamping device to clamp the object;
    a plurality of burls configured to provide a support surface for the object; and
    a plurality of gas bearing devices arranged to support the object prior to clamping by the clamping device of the object on the burls, each gas bearing device comprising:
       a gas bearing body having a free surface,
       a primary channel which extends through the gas bearing body and has an inlet opening in the free surface, and
       a secondary channel system which extends through the gas bearing body and has a discharge opening in the free surface.

13. The table according to claim 12, wherein the primary channel is in fluid communication with a source of sub-atmospheric pressure and the secondary channel system is in fluid communication with a source of pressurized gas.

14. The table according to claim 12, comprising a plurality of discharge openings surrounding the inlet opening.

15. The table according to claim 12, wherein the gas bearing body comprises a porous material comprising interconnected cavities, and the secondary channel system is formed by the interconnected cavities.

16. The table according to claim 12, wherein the flow resistance in the secondary channel system is higher than the flow resistance in the primary channel.

17. The table according to claim 12, wherein the flow resistance in the secondary channel system is higher than the flow resistance in the gap between the free surface and the object.

18. The table according to claim 12, wherein the plurality of gas bearing devices is adapted to change a shape of the object by controlling the pressure and/or gas flow rate at the inlet opening and/or the pressure and/or gas flow rate at the discharge opening, of at least one gas bearing device.

19. The table according to claim 18, further comprising:
a measurement system configured to obtain shape data of the object when arranged on the object table during activation of the gas bearing devices, and
a control device configured to receive the shape data from the measurement system and to control the pressure and/or gas flow rate based on the received shape.

20. A lithographic apparatus arranged to transfer a pattern from a patterning device onto a substrate, wherein the lithographic apparatus comprises the table according to claim 12.

* * * * *